United States Patent
Pawlowski (12)

(10) Patent No.: US 6,315,656 B1
(45) Date of Patent: Nov. 13, 2001

(54) FAN FOR MOUNTING ON A WALL MEMBER OF A CONTROL CABINET

(75) Inventor: Adam Pawlowski, Eschenburg-Wissenbach (DE)

(73) Assignee: Rittal-Werk Rudolf Loh GmbH & Co. KG, Herborn (DE)

(*) Notice: Subject to any disclaimer, the term of this patent is extended or adjusted under 35 U.S.C. 154(b) by 0 days.

(21) Appl. No.: 09/601,782

(22) PCT Filed: Dec. 15, 1998

(86) PCT No.: PCT/EP98/08257

§ 371 Date: Sep. 21, 2000

§ 102(e) Date: Sep. 21, 2000

(87) PCT Pub. No.: WO99/40766

PCT Pub. Date: Aug. 12, 1999

(30) Foreign Application Priority Data

Feb. 7, 1998 (DE) .............................. 198 04 906

(51) Int. Cl.[7] ..................................... H05K 5/00
(52) U.S. Cl. ............................. 454/184; 361/695
(58) Field of Search ........................... 454/184; 361/695, 361/696, 697

(56) References Cited

U.S. PATENT DOCUMENTS

| | | | |
|---|---|---|---|
| 3,120,166 | * 2/1964 | Lyman | 454/184 |
| 3,559,728 | * 2/1971 | Lyman | 165/55 |
| 4,648,007 | 3/1987 | Garner. | |
| 4,702,154 | * 10/1987 | Dodson | 454/184 |
| 4,840,225 | * 6/1989 | Foley et al. | 165/104.33 |
| 5,150,277 | * 9/1992 | Bainbridge et al. | 361/384 |
| 5,467,250 | * 11/1995 | Howard et al. | 361/696 |
| 5,528,454 | 6/1996 | Niklos. | |

FOREIGN PATENT DOCUMENTS

| | | |
|---|---|---|
| 88/01127 | 2/1988 | (WO). |
| 96/41511 | 12/1996 | (WO). |

\* cited by examiner

*Primary Examiner*—Harold Joyce
*Assistant Examiner*—Derek S. Boles
(74) *Attorney, Agent, or Firm*—Pauley Petersen Kinne & Fejer

(57) ABSTRACT

A fan with an input mounting plane and an output mounting plane. The fan is adapted to be mounted on a control cabinet wall member with an aeration passage. This invention produces an air flow which is as dust-free and turbulence-free as possible. For this purpose, the input mounting plane and the output mounting plane form an acute angle.

10 Claims, 2 Drawing Sheets

FAN FOR MOUNTING ON A WALL MEMBER OF A CONTROL CABINET

BACKGROUND OF THE INVENTION

1. Field of the Invention

This invention relates to a fan with an inlet mounting plane and an outlet mounting plane for installation on a wall element, which has a ventilation opening, of a switchgear cabinet, wherein a fan unit has fastening flanges on the inlet and outlet sides which are identical and are oriented parallel with respect to each other and is assembled from the fan unit and an additional housing.

2. Description of Related Art

Fan units of this type are known in diverse embodiments, wherein they can be directly connected with the wall element by one or the other fastening flange. Such fan units are conventional and can be provided in various sizes and use requirements. As a rule, the air flow is oriented the same in the area of the inlet and outlet fastening planes, as well as vertically with respect to these planes, as can be determined from PCT International Application WO 96/41511.

As is known from Patent Abstracts of Japan, volume 18, No. 480 (E1603), Sep. 8, 1994, and Japanese Patent Reference JP 06 164175A (Ricoh Cp. Ltd.), in such a fan unit only fastening planes extending parallel with each other can also be attached with an intermediate housing as a fan of the type previously mentioned wherein, however, its outlet plane continues to extend parallel with the wall element and does not cause a change in the flow direction of the fan unit. The direction of flow continues to remain vertically oriented with respect to the fastening planes and to the ventilation opening of the wall element.

As U.S. Pat. No. 4,648,007 shows, such fan units can be fastened in a housing to be ventilated at areas, which have various inclinations, of a wall element in order to change the direction of the air flow. For reasons of space this is not practical in connection with a flat wall element of a switchgear cabinet, because the fan unit must be attached at different locations of the wall element, depending on the way the switchgear cabinet is equipped.

It is also known to employ specially designed ventilators in cooling devices. In this case the inlet and the outlet fastening planes of the fan unit extend at an acute angle with each other, wherein the action of the fan as a suction or pressure fan is predetermined, as shown in PCT International Application WO 88/01127. Furthermore, depending on the location where they are used, the fans can also be designed as a fan with a filter, as shown in U.S. Pat. No. 5,528,454.

Particular requirements must be met when using such fans in the interior of a switchgear cabinet. The air will need to be aspirated from different locations in the cabinet interior and must also be supplied to the cabinet interior at different locations. This presumes a flexible installation, which must be matched to the existing conditions. In this case the wall element is often designed to be double-walled and is used as an air conduit, and is often even used as a heat exchanger housing. The wall element made of an outer leaf and an inner leaf forms a very flat air conduit which leads to congestion of the air, since the air flow which is aspirated and fed into the air conduit impacts on the outer wall element, which results in eddy formation. Moreover, the aspirating direction of the air flow cannot be optimally matched to the existing circumstances if fan units, which are customary in commerce, are to be used.

SUMMARY OF THE INVENTION

It is one object of this invention to design a fan of the type previously mentioned so that not only can it be selectively installed as a suction or a pressure fan on the wall element, but also that the flow direction of the aspirated or discharged air flow can be matched to the existing conditions with respect to the wall element with the ventilation opening.

This object is attained with fastening flanges of the fan unit and an inlet fastening plane of the intermediate housing having fastening receivers, which are matched to each other and are selectively connected with each other in interchangeable positions. An inlet fastening plane and an outlet fastening plane extend at an acute angle with respect to each other. The intermediate housing can be attached to the wall element via its outlet fastening plane at different directions of inclination of the inlet fastening plane.

With this design of the fan it is possible to connect the fan unit with the inlet fastening plane of the intermediate housing using one or the other fastening flange, so that the air flow between the air conduit of the wall element and the fan unit is no longer directed vertically on the outer wall leaf, but has a movement component which enhances flow-through and which can be affected and changed depending on the circumstances by a different attachment of the intermediate housing to the wall element.

The selectable employment of the fan is further simplified because the fastening flange of the fan housing is designed rectangular or square, and the fastening receivers of the fastening flanges of the fan housing and of the inlet fastening plane of the intermediate housing are matched to each other.

For connecting the intermediate housing with the wall element the outlet fastening plane of the intermediate housing has fastening bores for fastening screws, which can be screwed into screw receivers in the area of the openings of the wall element.

The intermediate housing is closed by wall elements between the inlet fastening plane with the inlet opening and the outlet fastening plane with the outlet opening. The fan is preferably designed as a fan with a filter.

BRIEF DESCRIPTION OF THE DRAWINGS

This invention will be explained in greater detail by preferred embodiments represented in the drawings wherein.

DESCRIPTION OF PREFERRED EMBODIMENTS

Figure 1:
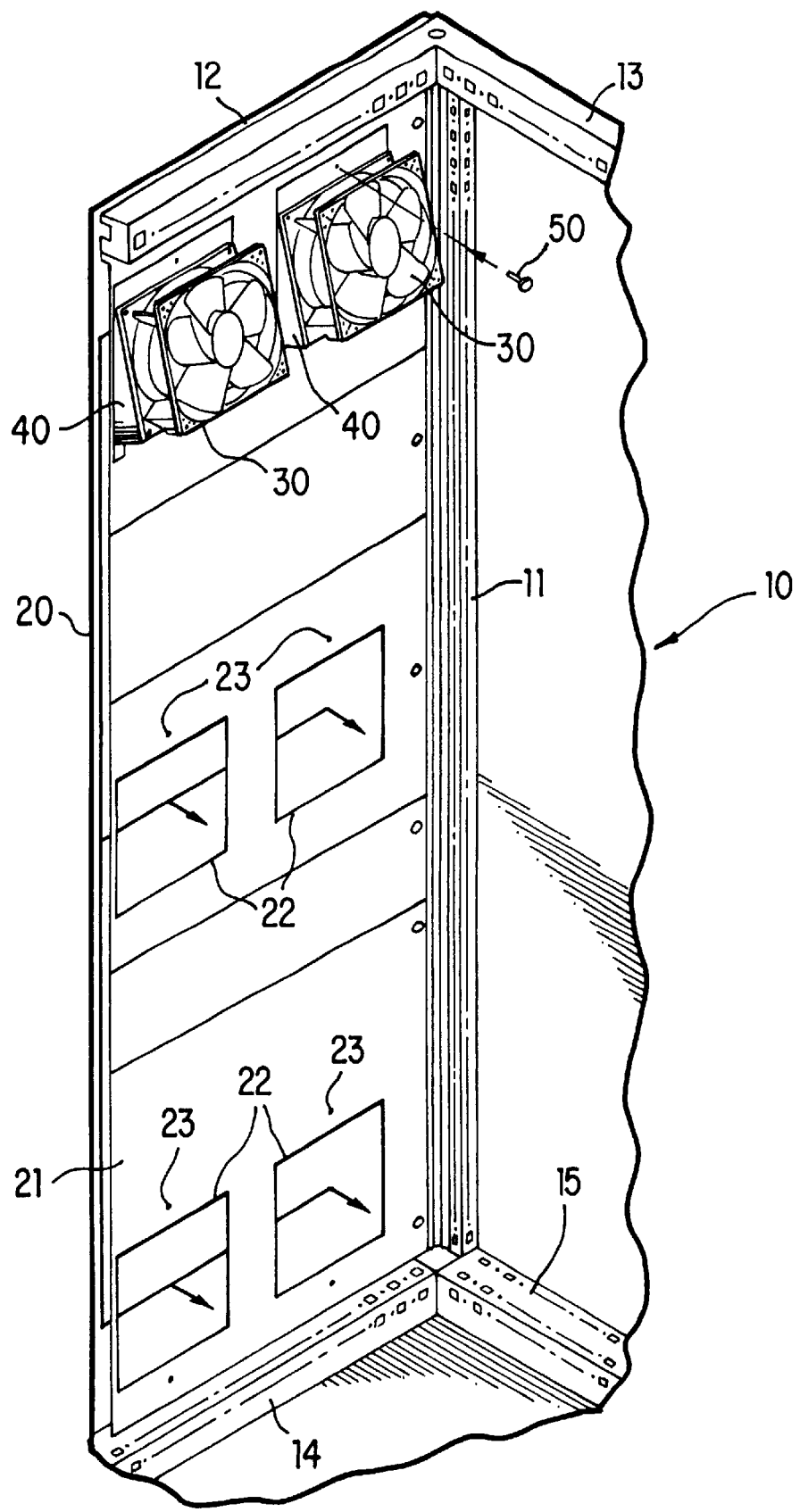
FIG. 1 is a partial sectional perspective view of a switchgear cabinet with a double-walled wall element with fans in accordance with one preferred embodiment.

The partial view in accordance with FIG. 1 shows a vertical frame leg 11 of a rack 10 of a switchgear cabinet, on which the horizontal frame legs 12 and 13 are attached at the top, and the horizontal frame legs 14 and 15 are attached at the bottom. One side of the rack 10 is closed by a double-walled wall comprising an inner wall element 21 and an outer wall element 20. The inner wall element 21 has square openings 22 which are connected with each other via the space between the two wall elements 20 and 21. In the exemplary embodiment, the openings 22 are cut in pairs in the upper, central and lower areas of the wall element 21. The space between the two wall elements 20 and 21 can also be divided into air conduits, which vertically connect the openings with each other. In this embodiment the double-walled wall is used as a heat exchanger, when the aspirated warm air from the switchgear cabinet contacts the outer wall element cooled by the outside air, so that the air can return cooled into the interior of the switchgear cabinet through the openings 22 which are not closed off by fans. The inner wall element 21 can be assembled from several partial wall elements.

The fans are designed in such a way that the inlet fastening plane and the outlet fastening plane are arranged at an acute angle with respect to each other. Therefore the fans, which are fastened in accordance with FIG. 1, aspirate the air obliquely from above, for example from the warmest location under the sheet metal cover of the switchgear cabinet. The aspirated air flow has a downward inclination and encounters the outer wall element 20 with a downward directed component. Therefore the impact on the outer wall element 20 does not lead to any noticeable eddy formation and to no congestion, so that an essentially advantageous course of the aspirated air flow over the heat exchanger is achieved. This results in a considerably improved efficiency of the heat exchanger.

There are several options for achieving the inclination at an acute angle between the inlet and the outlet fastening planes of the fan. The fan housing can be divided into two parts, wherein the closing fastening flanges of the housing elements extend at an acute angle with respect to each other when assembled. In this case the fan unit can be inserted into the assembled fan housing, so that the fan can be designed as a suction fan or a pressure fan.

Figure 2:
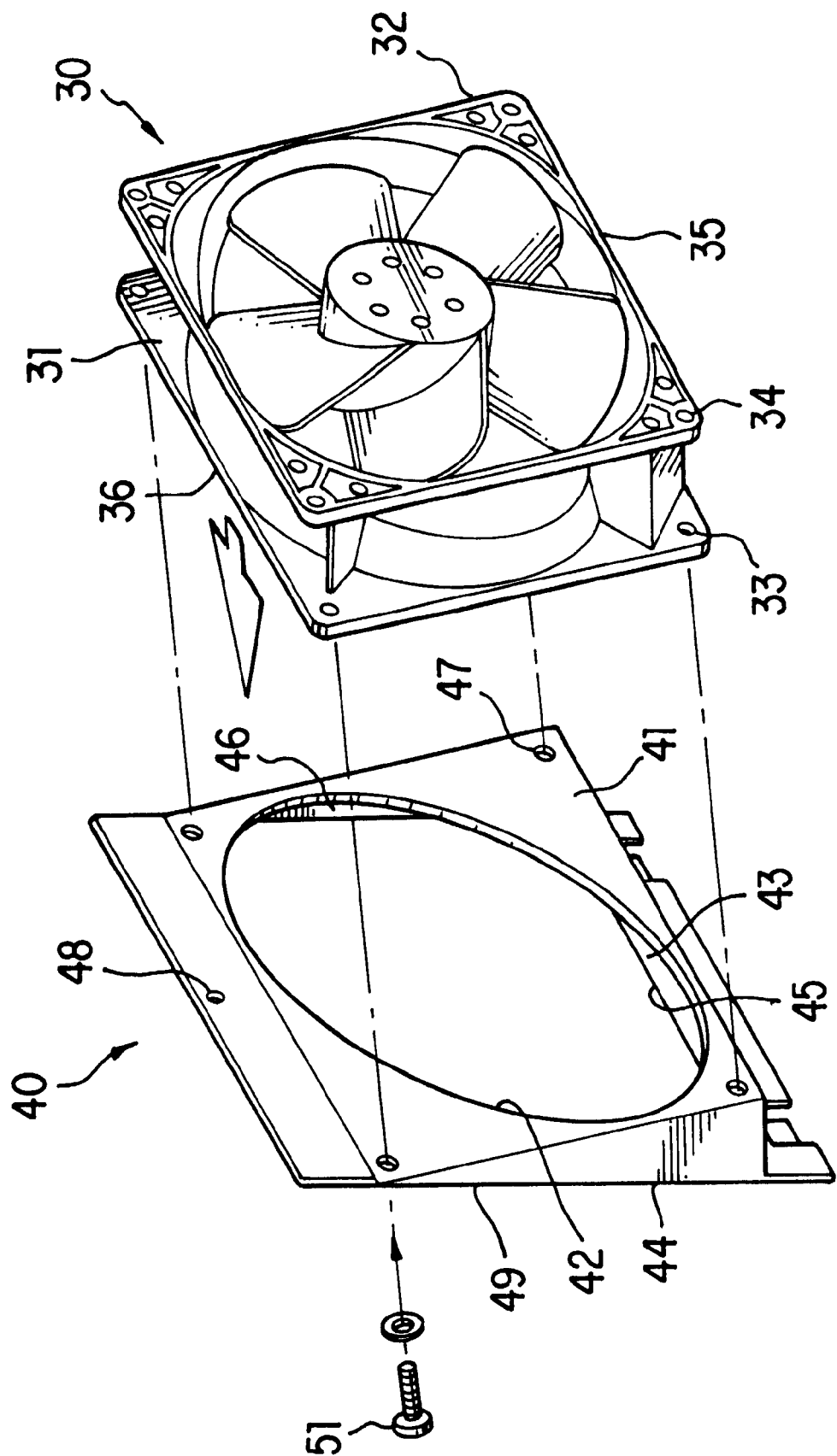
FIG. 2 is an exploded perspective view of a conventional cube-shaped fan which has fastening flanges extending parallel with each other and which can be connected with an intermediate housing, and with fastening planes that extend at an acute angle with respect to each other.

FIG. 2 shows an advantageous embodiment of the fan, using a cube-shaped fan unit 30 customary in commerce. The fan unit 30 terminates in fastening flanges 31 and 32, which define fastening planes 35 and 36 extending parallel with respect to each other. The two fastening flanges 31 and 32 are identical, are preferably embodied to be square and have fastening receivers 33 and 34 in an identical arrangement. So that the installation of the fan on the wall can take place in the inclined position, the fan unit 30 is connected with an intermediate housing 40, wherein there is again the option of connecting the fastening flange 31 or the fastening flange 32 with the inlet fastening plane 41 of the intermediate housing. Therefore fastening receivers 47, which match fastening receivers 33, or respectively 34, of the fan unit 30, are cut in the area of the inlet fastening plane 41 of the intermediate housing 40. The inlet fastening plane 41 of the intermediate housing 40 has a centered inlet opening 42. Together with frame elements, the walls 43, 44 and 46 on the outlet side of the intermediate housing 40 form an outlet fastening plane 49, which extends at an acute angle with respect to the inlet fastening plane 41. Together with the frame elements, the walls 43, 44 and 46 leave an outlet opening 45 in the outlet fastening plane 49. The fan unit 30 is fastened on the intermediate housing 40 with screws 51.

The fan assembled from the fan unit 30 and the intermediate housing 40 is fastened on the inner wall element 21 with fastening screws 50. The screws 50 are passed through the fastening bores 48 of the frame element of the intermediate housing 40 and are screwed into screw receivers 23 of the inner wall element 21, which are arranged in the area of the openings 22.

In the application shown in FIG. 1, the fan unit 30 is used as a suction fan. If designed as a pressure fan, the fan unit 30 can be rotated by 180° and attached in a different, downward extending inclination in an area of the lower openings 22. In this case the air is aspirated via the heat exchanger and is introduced cooled into the lowest part of the interior of the switchgear cabinet.

What is claimed is:

1. In a switchgear cabinet with a double-walled wall acting as a heat exchanger and formed by an outer wall element (20) and an inner wall element (21) wherein the inner wall element (21) has openings for connecting a fan in an upper area and a lower area, comprising:

a fan unit (30) and an intermediate housing (40), wherein the fan unit (30) is operated as a suction fan or a pressure fan and is connectible with the intermediate housing (40);

the fan unit (30) has identical fastening flanges (31, 33) on an inlet side and an outlet side which are aligned parallel with respect to each other and are selectively connected with an inlet fastening plane (41) of the intermediate housing (40);

an outlet fastening plane (49) of the intermediate housing (40) which is connectible with the inner wall element (21) is at an acute angle with respect to an inlet fastening plane (41) of the intermediate housing (40);

with the fan unit (30) connected as the suction fan with the intermediate housing (40) the fan unit (30) connected via the intermediate housing (40) in an area of an upper opening of the openings with the inner wall element (21); and air flow in the heat exchanger aspirated from the switchgear cabinet having a downward oriented component, and the fan unit (30) connected as the pressure fan with the intermediate housing (40) aspirating the air flow out of the heat exchanger from a top to a bottom of the switchgear cabinet.

2. In the switchgear cabinet in accordance with claim 1, wherein the fastening flange (31, 32) of the fan housing is rectangular.

3. In the fan in accordance with claim 2, wherein the outlet fastening plane (49) of the intermediate housing (40) has a plurality of fastening bores (48) for accommodating a plurality of fastening screws (50) which can be screwed into a plurality of screw receivers (23) in the area of the upper opening (22) of the wall element (21).

4. In the fan in accordance with claim 3, wherein the intermediate housing (40) is closed by a plurality of wall elements (43, 44, 46) between the inlet fastening plane (41) with an inlet opening (42) and the outlet fastening plane (49) with an outlet opening (45).

5. In the fan in accordance with claim 4, wherein the fan is operated as one of a suction fan and a pressure fan.

6. The fan in accordance with one of claims 1 to 5, characterized in that it is designed as a fan with a filter.

7. The fan in accordance with one of claims 1 to 6, characterized in that it can be operated as a suction or a pressure fan.

8. In the fan in accordance with claim 1, wherein the intermediate housing (40) is closed by a plurality of wall elements (43, 44, 46) between the inlet fastening plane (41) with an inlet opening (42) and the outlet fastening plane (49) with an outlet opening (45).

9. In the fan in accordance with claim 1, wherein the fan comprises a filter.

10. In the fan in accordance with claim 1, wherein the fan is operated as one of a suction fan and a pressure fan.

* * * * *